(12) United States Patent
Asami

(10) Patent No.: US 6,700,515 B2
(45) Date of Patent: Mar. 2, 2004

(54) DIGITIZER APPARATUS AND SEMICONDUCTOR TESTING APPARATUS

(75) Inventor: Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/374,199

(22) Filed: Feb. 26, 2003

(65) Prior Publication Data

US 2003/0128141 A1 Jul. 10, 2003

Related U.S. Application Data

(63) Continuation of application No. PCT/JP01/07466, filed on Aug. 30, 2001.

(30) Foreign Application Priority Data

Aug. 30, 2000 (JP) ........................................ 2000-260271

(51) Int. Cl.[7] .............................................. H03M 1/10
(52) U.S. Cl. ...................................................... 341/120
(58) Field of Search ................................ 341/120, 118, 341/117, 119, 121, 155

(56) References Cited

U.S. PATENT DOCUMENTS 6,556,156 B1 * 4/2003 Hungerbuehler ............ 341/120

FOREIGN PATENT DOCUMENTS

| JP | 7-2978 | 1/1995 |
|----|--------|--------|
| JP | 7-5213 | 1/1995 |

OTHER PUBLICATIONS

Translation of International Preliminary Examination Report, 3 pages, Nov. 26, 2002.

* cited by examiner

Primary Examiner—Brian Young
(74) Attorney, Agent, or Firm—Rosenthal & Osha L.L.P.

(57) ABSTRACT

An interleaving AD conversion type waveform digitizer apparatus includes, in a case where the number of interleaving ways is N that is equal to or larger than two, N AD converters connected to a structure for interleaving. The sampling timings of the respective AD converters are predetermined timings corresponding to the interleaving structure so as to allow successive outputs. The digitizer receives a signal to be measured output from a device under test and performs quantization. The time-series data from the AD converters are subjected to Fourier Transform by a butterfly operation technique. The digitizer apparatus further includes a window function multiplier for determining a coefficient based on a phase error, and a butterfly operation unit for performing a butterfly operation by inserting a phase correction coefficient.

37 Claims, 7 Drawing Sheets

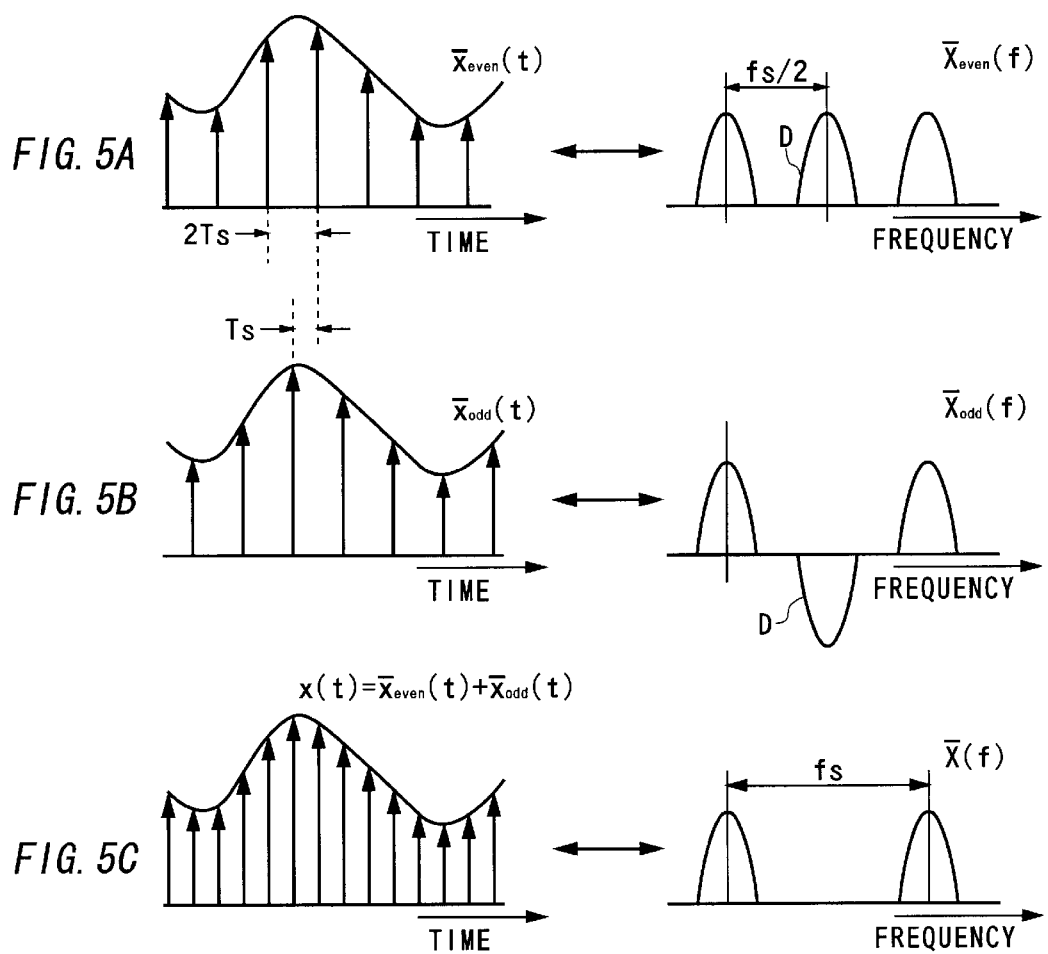

DIGITIZER APPARATUS AND SEMICONDUCTOR TESTING APPARATUS

This is a continuation application of PCT application No. PCT/JP01/07466 filed on Aug. 30, 2001 which claims priority from a Japanese patent application No. 2000-260271 filed on Aug. 30, 2000.

BACKGROUND OF THE INVENTION

1. Field of the Invention

The present invention relates to a waveform digitizer apparatus using an interleaving AD conversion technique. More particularly, the present invention relates to a correction means that detects and corrects a measurement error caused by phase errors between sampling timings in interleaving AD conversion. Further, the present invention also relates to a Japanese patent application No. 2000-260271 filed on the date of Aug. 30, 2000, the contents of which are incorporated herein by reference.

2. Description of the Related Art

A waveform digitizer apparatus using an N-way interleaving AD conversion method uses NAD converters so as to increase a seeming sampling rate. Also, it is necessary to perform sampling at precise timings.

An example where two-way interleaving is performed is described below. In this example, the number of time-series data units is $2^{12}=4096$. The waveform digitizer includes two AD converters, a window function multiplier, and an FT processor. The AD converter converts an analog signal to a digital signal at a fixed sampling rate. The two AD converters alternately sample the analog signal, thereby increasing the seeming sampling rate. The window function multiplier extracts data of the digital signal thus converted by the AD converter, the extracted data being data in a predetermined time domain. The window function multiplier multiplies the digital data by values obtained, at constant time intervals, from a predetermined function including a time axis. The window function multiplier multiplies the digital data by zero in the outside of the predetermined time region, thereby extracting the data in the predetermined time domain. In this example, the data extracted by the window function multiplier is a sequence of 4096 data units. The FT processor performs Fourier Transform for the digital signal extracted by the window function multiplier.

The FT processor receives the digital signal data sequence extracted by the window function multiplier and then outputs frequency spectra data formed by 4096 data units that have been subjected to Fast Fourier Transform. The FT processor includes the first FFT unit, the second FFT unit and a butterfly operation unit. Each of the first and second FFT units receives 2048 time-sequence data units and outputs 2048 intermediate data units (complex data units). The butterfly operation unit performs a butterfly operation that is the last one of known butterfly operations used in the FFT operation.

The butterfly operation unit performs the butterfly operation for the data sequences from the first and second FFT units and outputs the frequency spectra data of 4096 points obtained by the known butterfly operations applied in the FFT operation.

As an exemplary structure of a waveform digitizer in a semiconductor testing apparatus, a digitizer is known that includes the first and second AD converters to which an analog signal from a device under test is sent, an arranging unit and an FT processor. The first and second AD converters are completely the same in the sampling characteristics for performing AD conversion, including group delay characteristics and aperture delay characteristics. Typically, the sampled data sampled by the AD converters is temporarily stored in a buffer memory and is then supplied to the FT processor where the sampled data is subjected to the operation.

The analog signal for measurement that was output from the device under test is supplied to input ends of both the first and second AD converters. The first AD converter samples a sequence of even-numbered data units, so that it outputs a time series of the even-numbered time series data units, D0, D2, D4, . . . The second AD converter samples odd-numbered data units, so that it outputs a time series of the odd-numbered data units, D1, D3, D5, . . . The arranging unit receives both time series data and outputs a time series of data units obtained by alternately arranging the data units of both time series, D0, D1, D2, D3, D4, D5, . . .

The phase intervals of the sampling times of the two AD converters have to be adjusted in such a manner that the phase interval of the sampling times of one of the AD converters is equal to that of the other AD converter. Even in a case where there is an error in the phase intervals, the FFT operation is performed while considering the data units for which the FFT operation is to be performed as data units sampled at regular intervals. Therefore, correct frequency spectra cannot be obtained. Moreover, the coefficient of the multiplication by the window function multiplier is determined considering the data units to be multiplied by the coefficient as data units sampled at regular intervals. Therefore, the frequency spectra obtained by the FFT operation includes an error.

As described above, it was assumed in the conventional technique that the sampling timings did not change between a plurality of AD converters and the sampling clock rate was constant or within an acceptable error range. On the other hand, the sampling characteristics of the AD converter are affected by variation of parts of the AD converter, the environmental temperature, the change with the time and the change in the power source voltage, so that the sampling at regular intervals is affected. Moreover, in an application such as a semiconductor testing apparatus, in which the measurement is performed while the sampling frequency is changed, the group delay characteristics changes with the change of the sampling frequency. With these factors, the sampling timing is changed from the ideal sampling timing. This is not preferable in a case of obtaining the frequency spectra of the input signal with high precision and is therefore the practical problem.

SUMMARY OF THE INVENTION

Therefore, it is an object of the present invention to provide an interleaving AD conversion type digitizer apparatus and a semiconductor testing apparatus which can detect a sampling phase error between a plurality of AD converters and can correct operations performed by a window function multiplier and an FT processor. The above and other objects can be achieved by combinations described in the independent claims. The dependent claims define further advantageous and exemplary combinations of the present invention.

According to the first aspect of the present invention, a digitizer apparatus comprises: NA/D converters operable to convert an analog signal output from a semiconductor device to digital signals at different sampling timings, respectively, where N is an integer equal to or larger than two; a window function multiplier operable to multiply the digital signals by predetermined correction coefficients, respectively; and an FT processor operable to perform Fourier Transform (FT) for the digital signals multiplied by the predetermined correction coefficients, wherein the window function multiplier multiplies the digital signals by the correction coefficients based on the sampling timings.

The N A/D converters may sample the analog signals at substantially the same frequency, and the window function multiplier may multiply the digital signals by the correction coefficients based on phase errors between the sampling timings of the NA/D converters digital signals and an ideal sampling timing, respectively.

The window function multiplier may have N coefficient multipliers operable to multiply the digital signals by the predetermined correction coefficients, respectively, and the N coefficient multipliers may correspond to the N A/D converters, respectively, and multiply the digital signals converted by the A/D converters corresponding thereto by the correction coefficients, respectively.

The window function multiplier may have a memory unit operable to store a plurality of correction coefficients supplied in advance, and the window function multiplier may select one of the plurality of correction coefficients one by one for the respective digital signal.

The window function multiplier may calculate the correction coefficients to be multiplied by the respective digital signals based on the sampling timings, and includes a memory unit operable to store the calculated correction coefficients.

The window function multiplier may have N memory units respectively corresponding to N coefficient multipliers, and the N memory units may store the correction coefficients based on phase errors between the sampling timings of the A/D converters corresponding thereto and an ideal sampling timings.

The window function multiplier may multiply the digital signals sampled in an outside of a predetermined time domain by zero.

The FT processor may have an interleaving unit operable to generate a data sequence by arranging the digital signals multiplied by the correction coefficients in a predetermined order.

The FT processor may have an interleaving unit operable to generate a data sequence by arranging the digital signals that the window function multiplier did not multiply by zero in a predetermined order.

The FT processor may perform Fast Fourier Transform (FFT) for the data sequence.

The FT processor may further include: a first FFT processor operable to perform FFT for a sequence of even-numbered data units of the data sequence; a second FFT processor operable to perform FFT for a sequence of odd-numbered data units of the data sequence; and a butterfly operation unit operable to perform a butterfly operation for correcting the digital signals after being subjected to FFT by the first and second FFT processors, based on phase correction coefficients for correcting phase errors between the sampling timings by the N A/D converters and an ideal sampling timing.

The butterfly operation unit may multiply the digital signals after being subjected to FFT by one of the first and second FFT processors by a first phase correction coefficient for correcting the phase errors to perform the butterfly operation.

The butterfly operation unit may multiply the digital signals calculated by the butterfly operation by one of second and third phase correction coefficients that are based on the first phase correction coefficient.

The butterfly operation unit may perform an operation using the first, second and third correction coefficients expressed by the following expressions, $$\alpha = \exp[j\pi\tau/Ts]$$

$$\beta = 1/(1+\alpha)$$

$$\beta' = \alpha/(1+\alpha)$$

in a case where the first, second and third phase correction coefficients are $\alpha$, $\beta$, and $\beta'$, respectively, where $j$ is an imaginary unit, $\tau$ is the phase error, and $T$ is the ideal sampling timing.

The digitizer apparatus may comprise four A/D converters, wherein the FT processor has four FFT processors operable to perform FFT for the digital data converted by the A/D converters, respectively, the FT processor includes two stages of butterfly operation units operable to perform butterfly operations for correcting the digital signals after being subjected to FFT based on phase correction coefficients for correcting phase errors ($\tau 0$, $\tau 1$, $\tau 2$, $\tau 3$) between the respective sampling timings of the four A/D converters and an ideal sampling timing, the butterfly operation units at a first stage perform the butterfly operations for ($\tau 2 - \tau 0$) and ($\tau 3 - \tau 1$), and the butterfly operation unit at a second stage performs the butterfly operation for ($\tau 1 - \tau 0$).

The digitizer apparatus may comprise eight A/D converters, wherein the FT processor has eight FFT processors operable to perform FFT for the digital data converted by the A/D converters, respectively, the FT processor includes three stages of butterfly operation units operable to perform butterfly operations for correcting the digital signals after being subjected to FFT based on phase correction coefficients for correcting phase errors ($\tau 0$, $\tau 1$, $\tau 2$, $\tau 3$, $\tau 4$, $\tau 5$, $\tau 6$, $\tau 7$) between the respective sampling timings of the eight A/D converters and an ideal sampling timing, the butterfly operation units at a first stage perform the butterfly operations for ($\tau 4 - \tau 0$), ($\tau 6 - \tau 2$), ($\tau 5 - \tau 1$) and ($\tau 7 - \tau 3$), the butterfly operation units at a second stage perform the butterfly operations for ($\tau 2 - \tau 0$) and ($\tau 3 - \tau 1$), and the butterfly operation unit at a third stage performs the butterfly operation for ($\tau 1 - \tau 0$).

According to the second aspect of the present invention, a semiconductor testing apparatus for testing a semiconductor device, comprises: a pattern generator operable to generate a pattern signal and an expected value signal; a waveform shaping unit operable to shape a waveform of the pattern signal generated by the pattern generator; a semiconductor device contact portion, on which the semiconductor device is placed, operable to supply the pattern signal after being shaped by the waveform shaping unit to the semiconductor device and receive an analog signal output from the semiconductor device; a digitizer apparatus operable to convert the analog signal output from the semiconductor device to a digital signal; and a comparator operable to compare the expected value signal output from the pattern generator and the signal output from the digitizer apparatus, wherein the digitizer apparatus includes: NA/D converters operable to convert the analog signal output from the semiconductor device to digital signals at different sampling timings, respectively, where N is an integer equal to or larger than two; a window function multiplier operable to multiply the digital signals by predetermined correction coefficients, respectively; and an FT processor operable to perform Fourier Transform (FT) for the digital signals multiplied by the predetermined correction coefficients, and wherein the window function multiplier multiplies the digital signals by the correction coefficients based on the sampling timings.

The FT processor may include: an interleaving unit operable to generate a data sequence by arranging the digital signals multiplied by the correction coefficients in a predetermined order; a first FFT processor operable to perform FFT for a sequence of even-numbered data units of the data sequence; a second FFT processor operable to perform FFT for a sequence of odd-numbered data units of the data sequence; and a butterfly operation unit operable to perform a butterfly operation for correcting the digital signals after being subjected to FFT, based on phase correction coefficients for correcting phase differences between sampling timings of the N A/D converters and an ideal sampling timing.

The butterfly operation unit may multiply the digital signals after being subjected to FFT by one of the first and second FFT processors by a first phase correction coefficient for correcting the phase errors.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF DRAWINGS

FIGS. 5A, 5B and 5C show waveforms of a sampled signal in time domain and in frequency domain.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
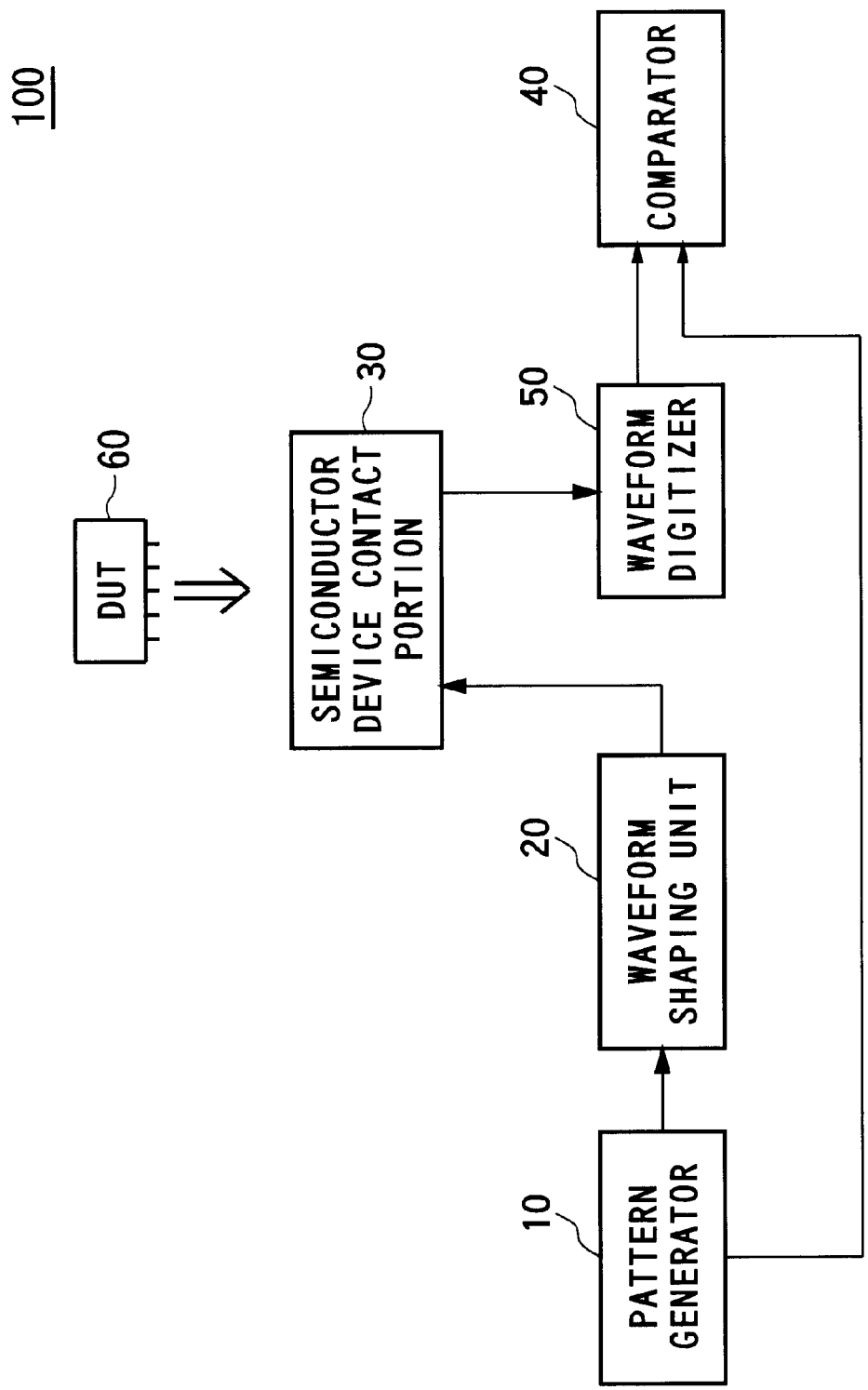
FIG. 1 illustrates an exemplary structure of a semiconductor testing apparatus 100 according to the present invention.

FIG. 1 illustrates an exemplary structure of a semiconductor testing apparatus 100 according to the present invention. The semiconductor testing apparatus 100 includes a pattern generator 10, a waveform shaping unit 20, a semiconductor device contact portion 30, a waveform digitizer 50 and a comparator 40. A semiconductor device 60 to be tested is placed on the semiconductor device contact portion 30. The pattern generator 10 generates an input signal to be supplied to the semiconductor device 60. The input signal is supplied to the waveform shaping unit 20. The waveform shaping unit 20 shapes the waveform of the input signal in accordance with the characteristics of the semiconductor device 60. The shaped input signal is supplied to the semiconductor device 60 via the semiconductor device contact portion 30. The semiconductor device 60 outputs an analog signal based on the input signal input thereto to the waveform digitizer 50 via the semiconductor device contact portion 30. The waveform digitizer 50 converts the received analog signal to a digital signal, and outputs the digital signal to the comparator 40. The comparator 40 determines whether or not the semiconductor device 60 is defective based on the digital signal. The pattern generator 10 may generate an expected value signal based on the generated input signal so that the comparator 40 determines whether or not the semiconductor device 60 is defective by comparing the expected value signal generated by the pattern generator 10 with the digital signal received from the waveform digitizer 50.

Figure 2:
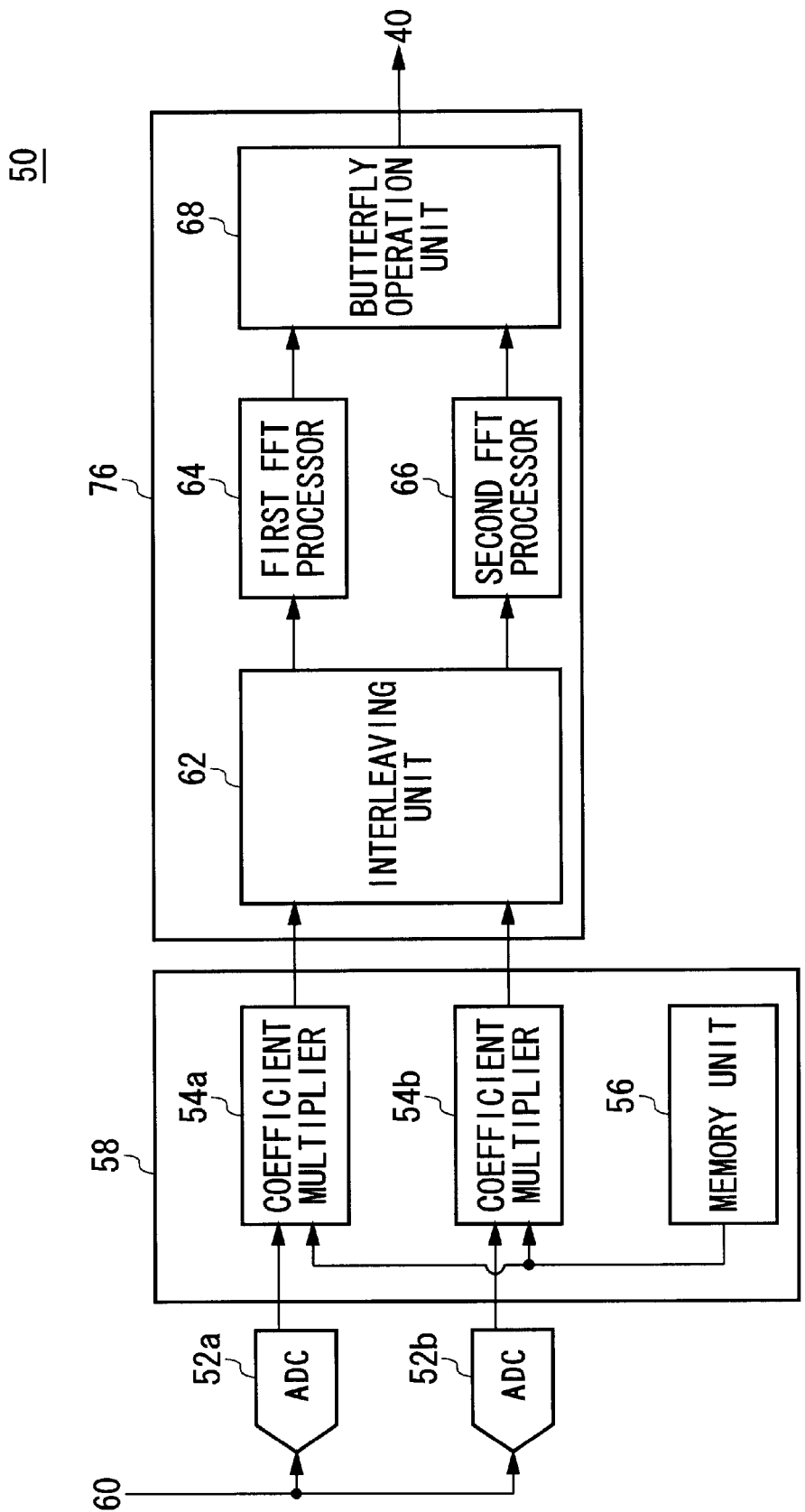
FIG. 2 shows an exemplary structure of a waveform digitizer (digitizer apparatus) 50 according to the present invention.

FIG. 2 shows an exemplary structure of the waveform digitizer (digitizer apparatus) 50 according to the present invention. The waveform digitizer 50 includes a plurality of AD converters (ADCs) 52, a window function multiplier 58 and an FT processor 76. In this example, the waveform digitizer 50 has two AD converters 52.

A plurality of AD converters 52 convert the analog signal output from the semiconductor device 60 to the digital signals by sampling the analog signal at different sampling times, respectively. The AD converters 52 sample the analog signal at substantially the same frequency (f). In the example, since the AD converters 52a and 52b alternately sample the analog signal, the frequency of the sampling by the two AD converters 52a and 52b is 2f. However, since the sampling is performed by the two AD converters, the intervals between the adjacent sampling timings are not constant in some cases. In other words, in some cases, there are phase errors between ideal sampling timings that are arranged at constant intervals and the sampling timings at which a plurality of AD converters alternately sample the signal. In this example, in a case where the sampling timing of one AD converter 52a is a reference, it is preferable that the other AD converter 52b sample the analog signal at an intermediate timing between the adjacent sampling timings of the AD converter 52a. However, the sampling timing of the AD converter 52b may contain the phase error τ.

The window function multiplier 58 has coefficient multipliers 54 and a memory unit 56. The window function multiplier 58 multiplies the digital signal output from the AD converter 52 by a predetermined correction coefficient, thereby selecting the waveform in a predetermined time domain from the analog signal waveform output from the semiconductor device 60. In the present invention, the window function multiplier 58 multiplies the digital signal by the correction coefficient that is based on the sampling timings of the AD converter 52. The window function multiplier 58 preferably multiplies the digital signal sampled in the outside of the predetermined time domain by zero as the correction coefficient.

The coefficient multiplier 54 multiplies the digital signal by the predetermined correction coefficient. The window function multiplier 58 may include a plurality of coefficient multipliers 54 corresponding to a plurality of the AD converters 52. These coefficient multipliers 54 multiply the digital signals converted by the corresponding AD converters 52 by the correction coefficients, respectively.

The window function multiplier 58 may include a memory unit in which a plurality of correction coefficients have been stored in advance. The window function multiplier 58 may select one of a plurality of correction coefficients for the respective digital signal one after another. Moreover, the window function multiplier 58 may include a memory unit that calculates the correction coefficient for each of the digital signals based on the sampling timing and stores the calculated correction coefficient. Furthermore, the window function multiplier 58 may include a plurality of memory units so as to respectively correspond to a plurality of coefficient multipliers. In this case, each of the memory units may store the correction coefficient based on a phase difference of the sampling timing of the corresponding AD converters from the ideal sampling timings arranged at constant intervals.

The FT processor 76 includes, for example, an interleaving unit 62, the first FFT processor 64, the second FFT processor 66, and a butterfly operation unit 68. The FT processor 76 performs Fourier Transform for the digital signals multiplied by the correction coefficients by the window function multiplier 58. The interleaving unit 62 arranges the digital signals multiplied by the correction coefficients in a predetermined order so as to generate a data sequence. The interleaving unit 62 may arrange the digital signals that the window function multiplier 58 did not multiply by zero in a predetermined order, thereby generating the data sequence. The FT processor 76 performs Fast Fourier Transform for the data sequence generated by the interleaving unit 62.

The first FFT processor 64 performs Fast Fourier Transform for even-numbered data units of the data sequence, while the second FFT processor 66 performs Fast Fourier Transform for odd-numbered data units of the data sequence.

The butterfly operation unit 68 corrects the phase error of the digital signals that have been subjected to Fast Fourier Transform based on the phase errors between the timings of the sampling performed by a plurality of AD converters 52 and the ideal sampling timings. In other words, the butterfly operation unit 68 performs a butterfly operation based on phase correction coefficients for correcting the phase errors. The first and second FFT processors 64 and 66 perform Fast Fourier Transform which typically performs the butterfly operation. The butterfly operation unit 68 according to the present invention can serve as the last stage of the butterfly operations in the first and second FFT processors. That is, the butterfly operation unit 68 may perform the last stage operation of those butterfly operations.

Figure 3:
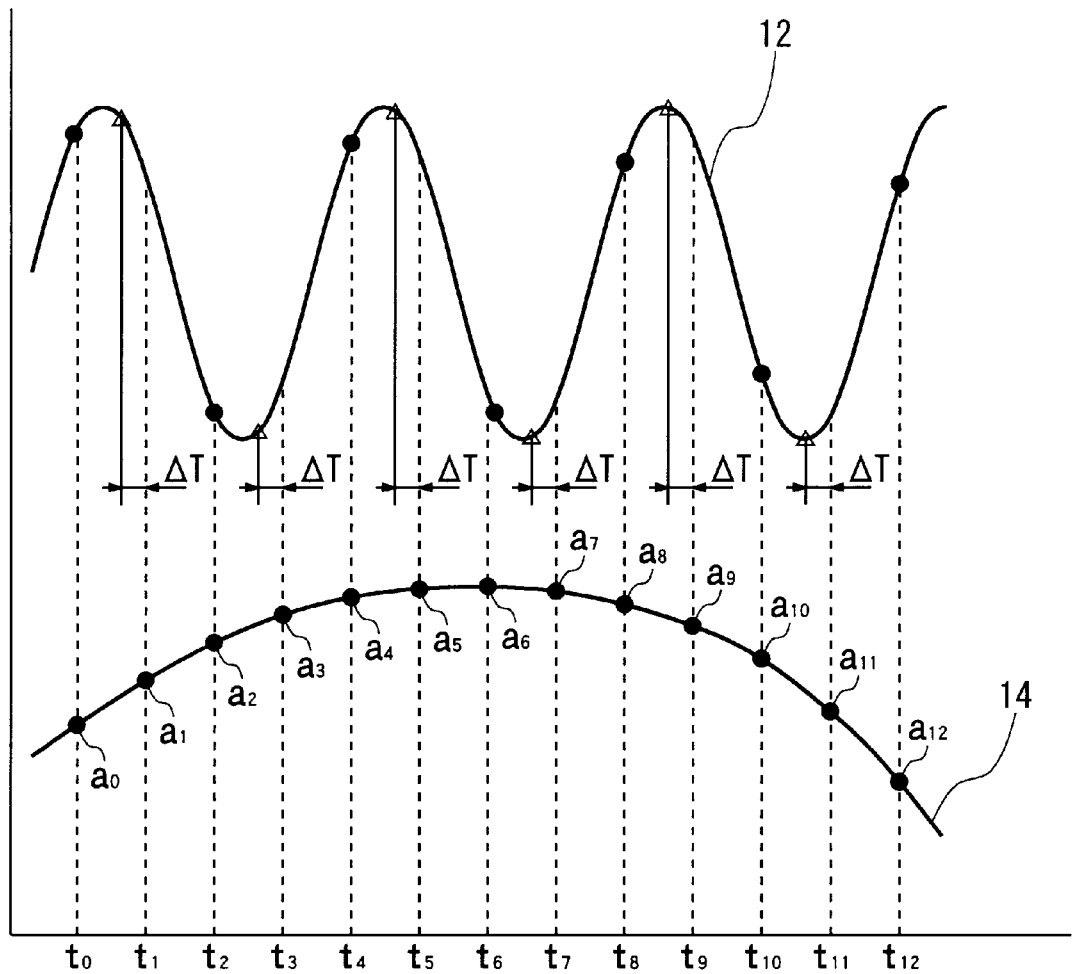
FIG. 3 explains a function of a window function multiplier 58.

FIG. 3 is a diagram for explaining the function of the window function multiplier 58. A waveform 12 represents the waveform of the analog signal output from the semiconductor device 60, while a waveform 14 represents a function for calculating the correction coefficients used in the window function multiplier 58. Moreover, circles on the waveform 12 represent points at which the AD converter 52a performs sampling, while triangles represent points at which the AD converter 52b performs sampling. The horizontal axis of the graph shown in FIG. 3 represents a time axis, while the vertical axis represents the intensity of the signal.

The period at which the AD converter 52 samples the analog signal 12 is obtained by synthesizing the period of the sampling by the AD converter 52a and that by the AD converter 52b. It is ideally preferable that the sampling be performed at constant intervals. However, it is practically difficult to precisely control the periods of the samplings by a plurality of AD converters 52. Thus, there are errors between the sampling timings of the AD converter 52 and the ideal sampling timings. It is assumed that the ideal sampling timings are $T_0, T_1, T_2, \ldots, T_{12}, \ldots$. When the sampling timings of the AD converter 52a, that are represented by circles, are in synchronization with the ideal sampling timings $T_0, T_1, T_2, \ldots T_{12}, \ldots, T_{2n}$, (n is a positive integer), it is preferable that the sampling timings of the AD converter 52b, that are represented by triangles, be in synchronization with $T_1, T_3, T_{11}, \ldots, T_{2n+1}$. However, the error $\Delta T$ is actually generated at the respective sampling timings.

In the conventional digitizer apparatus, however, the correction coefficient used in the window function multiplier 58 is set under the assumption where the sampling is performed at the ideal sampling timings. Thus, the values of the waveform 12 represented by triangles are multiplied by the correction coefficient containing the error with respect to the correction coefficient to be used in the multiplication, resulting in an error in the processing result of the waveform digitizer 50.

The window function multiplier 58 of the waveform digitizer (digitizer apparatus) according to the present invention multiplies the digital signal converted by the AD converter 52 by the correction coefficient based on the sampling timings of the AD converter 52. More specifically, the digital signal is multiplied by such a correction coefficient that points $a_0, a_1, a_2, \ldots, a_{12}, \ldots$ on the waveform 14, respectively representing the correction coefficients, shown in FIG. 3, are in synchronization with the sampling times of the AD converters 52a and 52b. When the function for calculating the correction coefficients and the sampling timing of the AD converter 52 are given, it is easy to calculate appropriate correction coefficients. In the above, the window function multiplier 58 is described referring to FIGS. 2 and 3 in a case where there are two AD converters 52. Please note that the operation and the effect of the window function multiplier 58 are similar in a case where three or more AD converters 52 are provided.

Moreover, in Fast Fourier Transform performed by the FT processor 76, the processing can contain an error if there is the phase error between the sampling timings of the AD converters 52 and the ideal sampling timings. According to the present invention, this error can be removed by performing correction by means of the butterfly operation unit 68.

Figure 4:
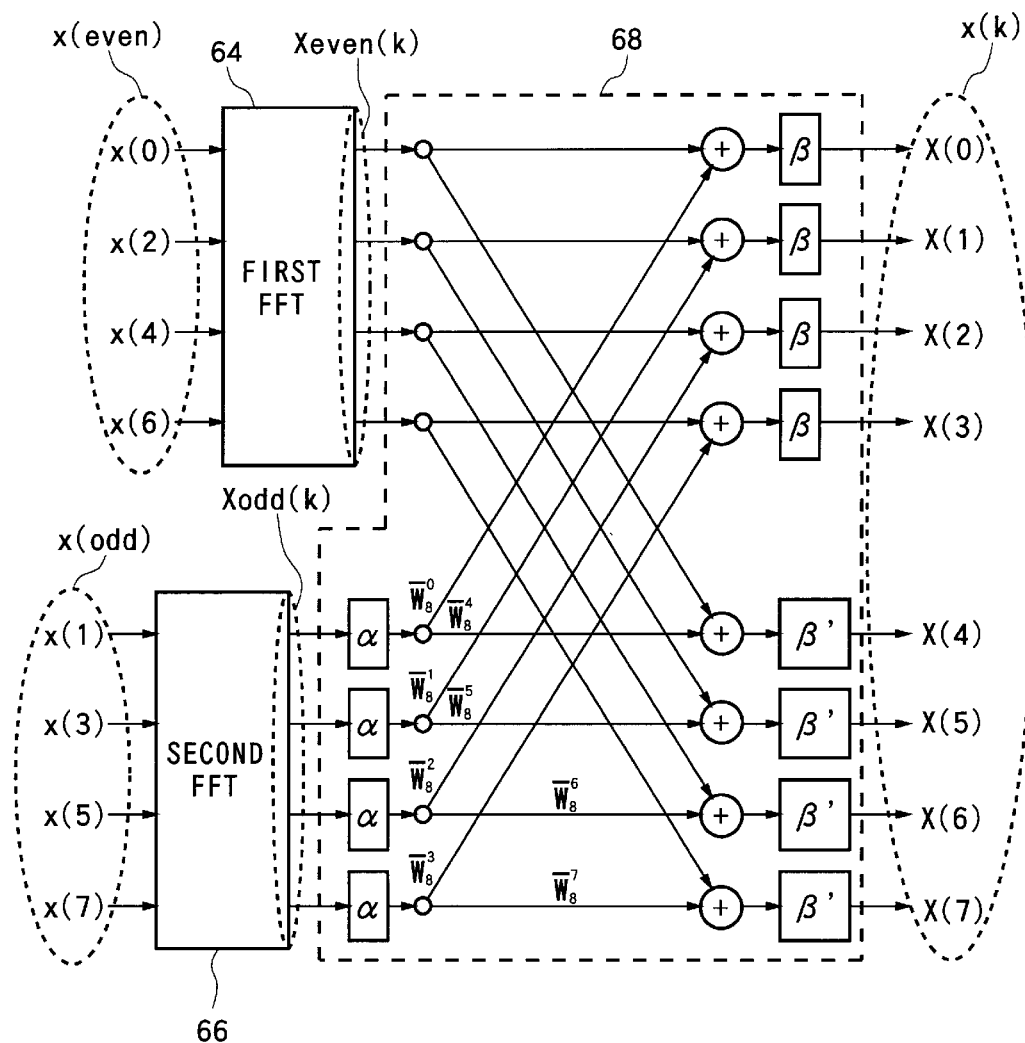
FIG. 4 explains a function of a butterfly operation unit 68 according to the present invention.

FIG. 4 is a diagram for explaining the function of the butterfly operation unit 68 according to the present invention. In this example, a case where the analog signal output from the semiconductor device 60 is converted to eight digital signals. In FIG. 4, time-domain waveform data is represented x(k) (k=0, 1, 2, . . . , 7) and frequency spectra data output from the FT processor 76 is represented by X(k).

The even-numbered data units of the time-domain waveform data x(k) are input to the first FFT processor 64, while the odd-numbered data units are input to the second FFT processor 66. Each of the first and second FFT processors 64 and 66 performs FFT for the data units input thereto. The data units output from the first FFT processor 64 and those output from the second FFT processor 66 are assumed to be Xeven(k) and Xodd(k), respectively. Receiving the above data units, the frequency spectra data X(k) is output as a result of the last-stage butterfly operation in accordance with the following expressions.

$$X(0)=Xeven(0)+W_8^0 Xodd(0)$$

$$X(1)=Xeven(1)+W_8^1 Xodd(1)$$

$$X(2)=Xeven(2)+W_8^2 Xodd(2)$$

$X(3)=Xeven(3)+W_8^3 Xodd(3)$ $X(4)=Xeven(0)+W_8^4 Xodd(0)$ $X(5)=Xeven(1)+W_8^5 Xodd(1)$ $X(6)=Xeven(2)+W_8^6 Xodd(2)$ $X(7)=Xeven(3)+W_8^7 Xodd(3)$ In the above expressions, $W_8=\exp[-j\,2\pi/8]=\cos[2\pi/8]-j\sin[2\pi/8]=1/\sqrt{2}-j(1/\sqrt{2})$, where j is imaginary unit.

Next, an embodiment of the present invention is described, referring to a typical FFT algorithm. It is assumed that the interval of the ideal sampling timings is Ts and the phase error of the sampling timing of the AD converter 52 with respect to the ideal sampling timing is τ. In this example, it is also assumed that there are two AD converters 52 and the odd-numbered sampling timings contain phase error τ. According to the present invention, in order to correct the phase error τ by the operation, the butterfly operation processing unit 68 of the FT processor is used for performing the last stage of Fast Fourier Transform, so that a butterfly operation with phase correction is performed in the butterfly operation unit 68. The last-stage butterfly operation including such correction can be represented by the following expressions.

$X(0)=\beta\{Xeven(0)+\alpha\cdot\overline{W}_8^0 Xodd(0)\}$ $X(1)=\beta\{Xeven(1)+\alpha\cdot\overline{W}_8^1 Xodd(1)\}$ $X(2)=\beta\{Xeven(2)+\alpha\cdot\overline{W}_8^2 Xodd(2)\}$ $X(3)=\beta\{Xeven(3)+\alpha\cdot\overline{W}_8^3 Xodd(3)\}$ $X(4)=\beta'\{Xeven(0)+\alpha\cdot\overline{W}_8^4 Xodd(0)\}$ $X(5)=\beta'\{Xeven(1)+\alpha\cdot\overline{W}_8^5 Xodd(1)\}$ $X(6)=\beta'\{Xeven(2)+\alpha\cdot\overline{W}_8^6 Xodd(2)\}$ $X(7)=\beta'\{Xeven(3)+\alpha\cdot\overline{W}_8^7 Xodd(3)\}$     Expression 1

Variables α, β, β' and $\overline{W}_8$ are complex numbers calculated from the phase error τ and the sampling interval Ts.

$\alpha=\exp[j\pi\tau/Ts]=\cos[\pi\tau/Ts]+j\sin[\pi\tau/Ts]$ $\beta=1/(1+\alpha)$ $\beta'=\alpha/(1+\alpha)$ $\overline{W}_8 = W_8^{1+\tau/Ts}$ √$\overline{W}_8$ is actually expressed by Expression D indicated below.

$\alpha=\exp[j\pi\tau/Ts]$     Expression (A)

$\beta=1/(1+\alpha)$     Expression (B)

$\beta'=\alpha/(1+\alpha)$     Expression (C)

$W_8 = W_8^{1+\tau/Ts}$     Expression (D)

$W_n = W_n^{1+\tau/Ts}$     Expression (E)

When n is assumed to be the number of the input signals and is substituted for 8, Expression (D) is written in a general form as follows.

$W_n = W_n^{(1+\tau/Ts)}$     Expression (E)

From Expressions (B) and (C), the following can be obtained.

$\beta+\beta'=1$ or $\beta'=\beta-1$, that is, β and β' can be considered to be points dividing a line of length 1.

Moreover, when the first phase correction efficient that is typically represented by α was once determined, the second and third phase correction coefficients that are typically represented by β and β' may be set irrespective of the first phase correction coefficient so as to satisfy the relationship, $\beta+\beta'=1$.

When the even-numbered input data units are considered as a reference, the sampled times at which the odd-numbered input data units were sampled are deviated. That is, the sampling pulses contain the phase errors. Therefore, in the present example, α is multiplied so as to rotate the phase by πτ/Ts. On the other hand, since α shifts the phases of all the data units in the butterfly operation by a small amount, it is necessary to cancel the shifted amount. In order to achieve this, β is multiplied. β' is also multiplied in a similar manner. Thus, the butterfly operation including complex conjugate numbers is performed approximately at Nyquest frequency.

By performing the above phase correction butterfly operation, the advantage is that the frequency spectra data X(k) in which the effect of the phase error τ was cancelled can be obtained. Although eight data units are input as the input data units in the above example, the similar concept of the phase error correction can be applied to a case of inputting $2^n$ input data units, where n is an arbitrary integer equal to or larger than one.

In a case of processing a data sequence including $m=2^n$ data units (n is an arbitrary integer equal to or larger than one) in a digitizer apparatus having a 2-way AD converter (ADC), for example, the butterfly operation unit 220 corrects the phase error τ in accordance with the following expressions.

$X(k) = \beta\{X_{even}(k) + \alpha \cdot \overline{W}_m^k X_{odd}(k)\}$ $X(p) = \beta'\{X_{even}(k) + \alpha \cdot \overline{W}_m^p X_{odd}(k)\}$ In the above expressions, k can change from 0 to $2^{n-1}-1$, while p can change from $2^{n-1}$ to $2^n-1$.

In addition, for the above expression, the following expressions are defined.

$\beta=1/(1+\alpha)$ $\beta'=\alpha/(1+\alpha)$ $W_m = W_m^{(1+\tau/Ts)}$

In the above expressions, Xeven(k) are values obtained by FFT for the even-numbered data sequence x(even) formed by the even-numbered data units output from the aforementioned interleaving unit (arranging unit 40), as shown in FIG. 4. Also, Xeven(p) are values obtained by FFT of the odd-numbered data sequence x(odd) formed by the odd-numbered data units output from the aforementioned arranging unit 40. X(k) and X(p) are the final values output from the butterfly operation unit 220 as finally output values of the digitizer apparatus.

A specific calculation is performed by using the above expressions. In a case where the sampling clocks c1kA and c1kB are 50 MHz, the sampling is performed at 100 MHz by interleaving. Thus, Ts=1/100 MHz=10 ns. In this case, assuming that the phase error τ is 2.5 ns, the following complex number values are obtained as the values of the variables α, β, β' and $\overline{W}_8$.

$$\tau/Ts = 0.25$$

$$\alpha = \exp[j\pi\tau/Ts] = \cos[\pi\tau/Ts] + j\sin[\pi\tau/Ts]$$
$$= 0.707 + j0.707$$

$$\beta = 1/(1+\alpha) = 1/(1.707 + j0.707) = 0.5 - j0.207207$$

$$\beta' = \alpha/(1+\alpha) = 1 - \beta = 0.5 - j0.207107$$

$$\overline{W}_8 = W_8^{(1+\tau/Ts)} = (0.707 - j0.707)^{1.25} = 0.555 - j0.831$$

When these values are used in the expressions for obtaining X(0) to X(7), the frequency spectra data X(k) in which the effect of the phase error τ was cancelled can be obtained. $\overline{W}_8$ is a complex number referred to as a rotator or a twiddle factor. Please note that the sampling clocks c1kA and c1kB are the sampling clocks of the AD converters 52a and 52b, respectively.

The value of τ can be easily obtained from the frequency spectra obtained by applying a sinusoidal wave signal having a known single frequency, performing the sampling by means of the ADC similarly, and performing FFT for each of the data units of the data sequence obtained by the sampling. Therefore, even if τ has not been measured in advance, the measurement can be performed only once by inserting the sinusoidal wave signal in the outside of the band of the signal to be measured.

Accordingly, since the butterfly operation unit 68 is provided that multiplies the data sequence obtained by FFT by the second FFT processor 64 by the first phase correction coefficient that is typically represented by α, and then multiplies the data sequence obtained by FFT operation by the first and second FFT processors 64 and 66 by the second and third phase correction coefficients that are typically represented by β and β', respectively, even if the timings at which the sampling clock c1kB is applied contain the timing error τ, the result of FFT in which the error caused by τ was cancelled can be obtained.

Although the specific example in which two-way interleaving is performed is described in the above description, the present invention can be realized also in a case of N-way interleaving (N is an arbitrary positive integer) by applying the aforementioned correction means.

Next, the phase error correction means is described in a stepwise manner, referring to expressions. First, Expressions 101 to 119 are shown, and the description is then made.

$$\overline{x}(t) = x(t) \cdot \sum_{n=-\infty}^{\infty} \delta(t - nT_s) \quad \text{Expression 101}$$

$$= \sum_{n=-\infty}^{\infty} x(nT_s)\delta(t - nT_s)$$

$$p_{even}(t) = \sum_{m=-\infty}^{\infty} \delta(t - 2mT_s) \quad \text{Expression 102-1}$$

$$p_{odd}(t) = \sum_{m=-\infty}^{\infty} \delta(t - 2(m+1)T_s - \tau) \quad \text{Expression 102-2}$$

$$\overline{x}_{even}(t) = \sum_{m=0}^{N/2-1} x(2mT_s)\delta(t - 2mT_s) \quad \text{Expression 103-1}$$

$$\overline{x}_{odd}(t) = \sum_{m=0}^{N/2-1} x((2m+1)T_s + \tau)\delta(t - (2m+1)T_s - \tau) \quad \text{Expression 103-2}$$

$$\overline{X}(f) = X(f) * P(f) \quad \text{Expression 104}$$

$$= X(f) * \frac{1}{T_s}\sum_{k=-\infty}^{\infty} \delta\left(f - \frac{k}{T_s}\right) = \frac{1}{T_s}\sum_{k=-\infty}^{\infty} X\left(f - \frac{k}{T_s}\right)$$

$$\overline{X}_{even}(f) = \frac{1}{2T_s}\sum_{k=-\infty}^{\infty} X\left(f - \frac{k}{2T_s}\right) \quad \text{Expression 105-1}$$

$$\overline{X}_{odd}(f) = \frac{1}{2T_s}\sum_{k=-\infty}^{\infty} X\left(f - \frac{k}{2T_s}\right)e^{-j\pi k} \quad \text{Expression 105-2}$$

$$\overline{X}(f) = \overline{X}_{even}(f) + \overline{X}_{odd}(f) = \frac{1}{T_s}\sum_{k=-\infty}^{\infty} \frac{1 + e^{-j\pi k(1+\tau/T_s)}}{2} X\left(f - \frac{k}{2T_s}\right) \quad \text{Expression 106}$$

$$\overline{X}'(f) = \overline{X}_{even}(f) + e^{j\pi\tau/T_s}\overline{X}_{odd}(f) \quad \text{Expression 107}$$

$$\overline{X}'(f) = \frac{1}{T_s}\left\{\left(\frac{1 + e^{j\pi\frac{\tau}{T_s}}}{2}\right)X(f) + \left(\frac{1 + e^{-j\pi\frac{\tau}{T_s}}}{2}\right)X\left(f - \frac{1}{T_s}\right)\right\} \quad \text{Expression 108}$$

-continued $$\overline{X}''(f) = \begin{cases} \left(\dfrac{1+e^{j\pi\frac{\tau}{T_s}}}{2}\right)^{-1} \overline{X}'(f) & (0 < f \le 1/2T_s) \\ \left(\dfrac{1+e^{-j\pi\frac{\tau}{T_s}}}{2}\right)^{-1} \overline{X}'(f) & (1/2T_s < f \le 1/T_s) \end{cases}$$

Expression 109

$$\overline{X}''(f) = \frac{1}{T_s}\left(\overline{X}(f) + \overline{X}\left(f - \frac{1}{T_s}\right)\right)\left(0 \le f \le \frac{1}{T_s}\right)$$

Expression 110

$$DFT(k) = \sum_{n=0}^{N-1} x(nT_s)e^{-j2\pi kn/N} \quad (k = 0, \ldots, N-1)$$

Expression 111

$$\overline{X}(f) = \sum_{n=0}^{N-1} x(nT_s)e^{-j2\pi fnT_s}$$

Expression 112

$$DFT(k) = \overline{X}\left(\frac{k}{NT_s}\right)$$

Expression 113

$$DFT_{even}(k) = \sum_{m=0}^{N/2-1} x(2mT_s)e^{-j2\pi kn/N} \quad (k = 0, \ldots, N/2-1)$$

Expression 114

$$DFT_{odd}(k) = \sum_{m=0}^{N/2-1} x((2m+1)T_s + \tau)e^{-j2\pi kn/N} \quad (k = 0, \ldots, N/2-1)$$

$$DFT_{even}(k) = \overline{X}_{even}\left(\frac{k}{NT_s}\right) \quad (k = 0, \ldots, N/2-1)$$

Expression 115

$$DFT_{odd}(k) = e^{j2\pi f(\tau+T_s)} \overline{X}_{odd}\left(\frac{k}{NT_s}\right) \quad (k = 0, \ldots, N/2-1)$$

$$\overline{X}''\left(\frac{k}{NT_s}\right) = \begin{cases} \dfrac{2}{1+\alpha}\left[DFT_{even}(k) + \alpha \cdot W_N^k DFT_{odd}(k)\right] & (k = 0, \ldots N/2-1) \\ \dfrac{2\alpha}{1+\alpha}\left[DFT_{even}(k) + \alpha \cdot W_N^k DFT_{odd}(k)\right] & (k = N/2, \ldots, N-1) \end{cases}$$

Expression 116

$$DFT(k) = DFT_{even}(k) + e^{-j2\pi k/N} DFT_{odd}(k)$$

Expression 117

$$A_i = |DFT(n)| \quad (i = 1, 2)$$

Expression 118-1

$$\phi_i = \arg[DFT(n)] \quad (i = 1, 2)$$

Expression 118-2

$$\tau/T_s = (\phi_1 - \phi_2)/2\pi f_0 T_s + 1$$

Expression 119

In Expression 101, x̄(t), that is, x(t)·p(t) is the waveform of the sampled signal. In this expression, $T_s$ is the sampling period; δ(t) is Delta function; p(t) is the sampling pulse sequence; and x(t) is the waveform of the signal to be measured, i.e., the input signal to the ADC.

FIGS. 5A, 5B and 5C show the waveform of the sampled signal in time domain (left side) and in frequency domain (right side). Since two-way interleaving by means of the first and second ADCs 31 and 32 is considered in this example, the signal is alternately sampled at the sampling period of $2T_s$, as shown in FIGS. 5A and 5B. FIG. 5A shows the sampling of the even-numbered data units, that is represented by Expression 102-1. FIG. 5B shows the sampling of the odd-numbered data units, that is represented by Expression 102-2.

The phase error between the sampling clocks of the ADCs is assumed to be a delay of τ, as shown in FIG. 3. Based on this assumption, the sampling expression for the even-numbered data units is represented by Expression 103-1, while that for the odd-numbered data units is represented by Expression 103-2.

Please note that the term of τ in Expression 102-2 represents the phase error in the sampling sequence. When τ=0, the relationship, P(t)=Peven(t)+Podd(t), is satisfied.

The sampled waveform on the even-number side, $\overline{x}_{even}(t)$ and that on the odd-number side $\overline{x}_{odd}(t)$ are represented by Expressions 103-1 and 103-2, respectively, using the limited number of data units. It should be noted in Expressions 103-1 and 103-2 that the sampling period is $2T_s$ and the number of data units is N/2.

First, a case of τ=0 is considered.

The relationship among $\overline{x}_{even}(t)$, $\overline{x}_{odd}(t)$ and $\overline{x}(t)$ on the time axis is considered on the frequency axis. In this case, Fourier Transform is expressed by a product of the waveforms on the time axis and therefore is convolution. Thus, from Expression 101, Fourier Transform is represented by Expression 104.

In Expression 104, an asterisk symbol (*), represents convolution. The waveform after being subjected to Fourier Transform is usually expressed with a capital letter. Similarly, Fourier Transform on the even-number side, $\overline{X}_{even}(f)$ is given by Expression 105-1 while Fourier Transform on the odd-number side, $\overline{X}_{odd}(f)$ is given by Expression 105-2.

The relationship among $\overline{X}_{even}(f)$, $\overline{X}_{odd}(f)$ and $\overline{X}(f)$ are shown in the right half of FIGS. 5A, 5B and 5C. As is apparent from FIG. 5C, the terms in which k is the odd number in the sum of Expression 105 have a reverse sign to the sign of the terms in which k is an odd number in the sum of Expression 105-1. Therefore these terms are added then canceled.

Next, a case where there is the phase error τ, that is not equal to zero, is considered. The definition $\overline{X}(f)=\overline{X}_{even}(f)+\overline{X}_{odd}(f)$ is given by Expression 106.

The term of k=1 that serves as a spurious component in Expression 106 does not become zero when τ is not equal to zero. From Expression 106, the factor $½(1-e^{-j\pi\tau/T_s})$ provides a ratio of the spurious component of X(f) to the signal component.

Next, the principle of the phase error correction is described.

$\overline{X}_{even}(f)+\overline{X}_{odd}(f)$ contains the spurious component caused by the phase error τ. It is necessary to generate a waveform that is not affected by τ. It is then considered whether or not Expression 107 can be used as such a waveform, with appreciation that the factor $½(1-e^{-j\pi\tau/T_s})$ is important to consideration of the effect of the error.

In Expression 107, the component $e^{j\pi\tau/T_s}$ is inserted before $\overline{X}_{odd}(f)$ in order to cancel the spurious component. When $\overline{X}'(f)$ is written so as to contain the terms of k=0, 1 and 2, Expression 108 is obtained.

The term of k=1 is canceled in Expression 108. The second term on the right side of Expression 108 serves as an aliasing component. In order to estimate whether or not $\overline{X}'(f)$ can be used as an alternative, Expression 108 has to be examined.

The waveform $\overline{X}'(f)$ is different from an intended waveform because there is an unnecessary factor $½(1+e^{j\pi\tau/T_s})$ as the first term in Expression 108 as compared with Expression 104. The problem is to correct this factor and a similar factor contained in the aliasing component. If the sampling rule of X(f)=0 when $|f|>½T_s$ is satisfied, the frequency components of the terms of X(f) and X(f−1/Ts) are distributed onto both sides of Nyquest frequency ½Ts. Therefore, the correction for the lower half (Nyquest frequency or less) of $\overline{X}'(f)$ and the correction for the upper half (Nyquest frequency or more) can be made independently of each other. The waveform represented by Expression 109 corresponds to these corrections.

Next, how to obtain the correction algorithm is described.

The phase error correction algorithm described below is a technique for calculating $\overline{X}''(f)$ from the actually measured data x(nTs) (n=0, 1, . . . , N−1). A practical calculation into frequency domain is DFT (Discrete Fourier Transform). DFT is represented by Expression 111 as already known.

First, a relationship between DFT(k) and X(f) in Expression 111 is described. When Expression 101 is subjected to Fourier Transform, Expression 112 is obtained. From the comparison of Expression 111 with Expression 112, Expression 113 is obtained.

From Expression 113, it can be appreciated that DFT is a calculated value of $\overline{X}'(f)$ obtained by sampling at the frequency points of k/NTs. From this, the data obtained by interleaving ADC technique is applied. When DFT of the data obtained by the first ADC and DFT of the data obtained by the second ADC are respectively represented as DFTeven (k) and DFTodd(k), these are given by Expression 114.

The point of Expression 114 to which attention is to be paid is that both DFTs are performed for N/2 data units. From the comparison of Expression 114 with Fourier Transform of Expression 102, Expression 115 can be obtained. From DFTeven (k) and DFTodd (k), how to calculate $\overline{X}''(f)$ is obtained as Expression 116 from the relationship among Expressions 108, 109 and 115.

Here, The coefficient α is defined as exp [jπτ/Ts] and the rotation factor $\overline{W}_n$ is defined as exp [j2π(1+τ/Ts)/N]. Thus, the method for correcting the phase error is given by Expression 116. When Expression 116 is reviewed, it is found that Expression 116 is represented as expansion of FFT. When τ=0, Expression 117 is established from Expressions 111 and 114.

Here, Wn=exp [j2π/N]. The FFT algorithm is based on Expression 117, and calculates DFT of all the data points from the even-numbered data points and the odd-numbered data points. The calculation procedure is shown as a signal flow in FIG. 4 in a case of N=8. This procedure is called as a "butterfly operation". In FFT, repetitive butterfly operation is used in order to perform the DFT operation.

From the comparison of Expression 117 with Expression 116, the signal flow diagram of Expression 116 can be obtained with small modification. The gain components α, β and β' are added. Please note that α is the phase shift coefficient (the first phase correction coefficient). β and β' serve as the second and third phase correction coefficients, respectively, and may be set as follows: β=1/(1+α) and β'=α/(1+α). Moreover, β and β' may have no relationship with α and may be set to satisfy the relationship of β+β'=1. Furthermore, it is preferable that the improved rotation component is $$\overline{W}_n = W_n^{1+\tau/T_s}.$$

As described above, it is not necessary to add new hardware in the present example, thus enabling excellent cost performance to be obtained and only requiring the small modification. Moreover, according to the example of the present application, precision in the semiconductor device test is improved, thus contributing to the improvement of fabrication yields. The above algorithm generates the corrected waveform in frequency domain. By applying Inverse Fast Fourier Transform (IFFT) to the waveform generated by that algorithm, waveform data in time domain can be obtained from the data in frequency domain.

Next, the measurement of the phase error τ is described.

In the above description, it was assumed that the value of the phase error τ was known. Thus, the value of the phase error τ was assumed to be used in the phase error correction. In the following description, it is briefly explained how to measure this value and other values, so that the values can be used in calibration of mismatch between a plurality of ADCs, including a voltage gain.

In the measurement of τ, a sinusoidal test signal is supplied to input ends of a plurality of ADCs that are time-interleaved. The outputs from the ADCs are subjected to Fourier Transform. The frequency of the test signal is appropriately selected so as to minimize the effect of quantization noises and leak by the window function.

Considering the timing offset and the ADC gain, the output waveform of each ADC is expressed as follows.

$$A \sin(2\pi f0 t+\Phi)$$

In the above expression, A is the gain while Φ is the phase caused by the sampling timing offset. f0 is the frequency of the test signal and is selected to satisfy fs=nf0 (n is a prime number). The values of A and Φ are obtained from DFT data of the ADC as indicated by Expressions 118-1 and 118-2.

In Expressions 118-1 and 118-2, |z| is an operation for obtaining an absolute value of a complex number z, while arg[z] is a phase angle. The error between the output values from both the ADCs are caused by the disagreement of the gain and timing. The value of A1/A2 obtained from Expression 118-1 is multiplied by the data from the second ADC 32 in advance in order to correct the gain disagreement. The value of τ is obtained from Expression 119.

The phase correction butterfly operation unit 68 in the above example may be applied in a case of using $2^n$ ADCS, where n is an arbitrary positive integer equal to or larger than one.

Figure 6A:
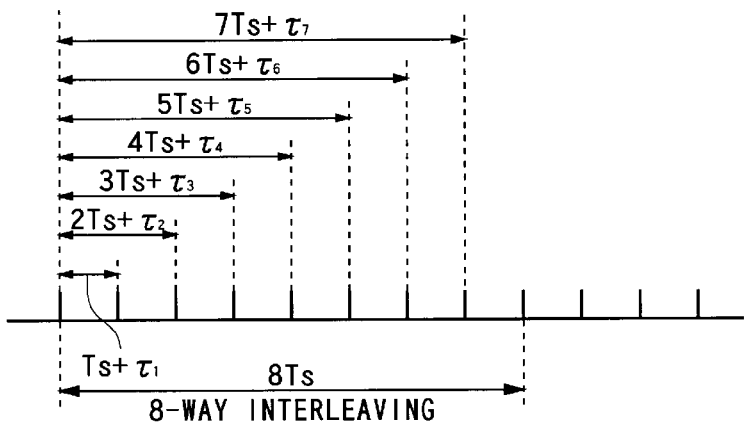
FIGS. 6A and 6B show the principle and structure in a case of 8-way interleaving.
Figure 6B:
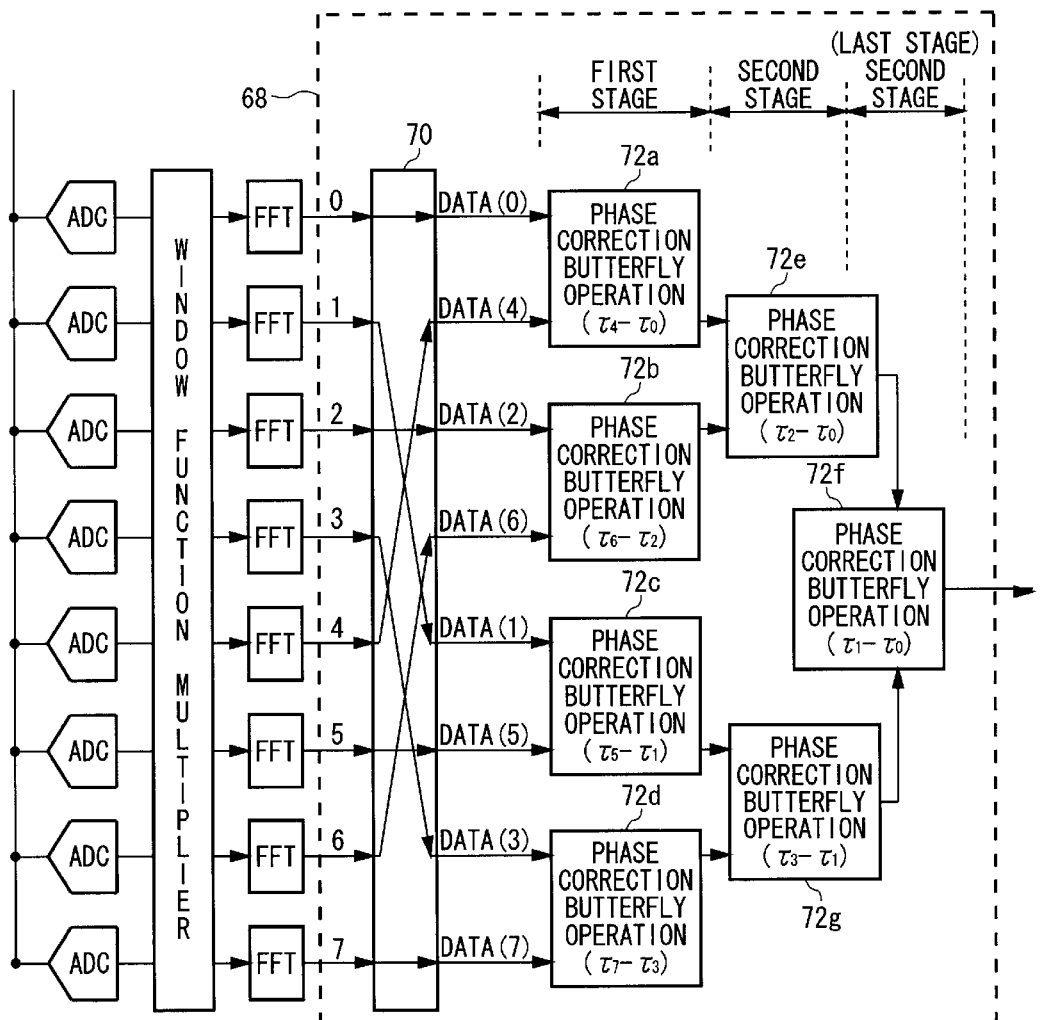

FIGS. 6A and 6B show the principle and the structure in a case of 8-way interleaving. It is assumed that, considering the first way as a reference timing, the phase errors between the other seven ways and the reference timing are τ1, τ2, τ3, τ4, τ5, τ6 and τ7, respectively. The phase error measurement method for obtaining τ1, τ2, τ3, τ4, τ5, τ6 and τ7 is similar to the measurement method of τ in a case of two-way interleaving described above. FIG. 6B shows an exemplary digitizer apparatus which uses data obtained by interleaving 8 ADCs. The data is first subjected to FFT. Next to the FFT operation processor, seven butterfly operation units 72 arranged in three stages are provided in the digitizer apparatus. The window function multiplier shown in FIG. 6B may have the same or similar function and structure as/to those of the window function multiplier 58 described referring to FIGS. 2 and 3.

The internal structure of the phase correction butterfly operation unit 68 in the case of 8-way interleaving is formed by a bit-reverse unit 70 and seven phase correction butterfly operation units 72, because the butterfly operation with phase correction according to the present invention has to be applied to the last stage, i.e., the third stage as the number of interleaving ways, 8 is $2^3$. Thus, according to this example, in a case of interleaving, $2^m$ input data units by $2^m$ ADCs generally, m stages of the phase error correction butterfly operation are performed, so that $$2^{m-1}+2^{m-2}+\ldots+2^{m-(m+1)}+2^{m-m}$$

that is, $$2^{m-1}+2^{m-2}+\ldots+2^1+2^0 (=1)$$

phase error correction butterfly operation units 220b are provided. For example, when m=3 as in the present example, $2^2+2^1+1=7$ phase error butterfly operation units 72 are provided.

The butterfly operation units 72 receive the output data of the respective ways (DATA(0) to DATA(7)) of FFT operation results from eight channels of ADCs, and perform butterfly operations for every two inputs. More specifically, since there are eight channels, four phase correction butterfly operation units 72a, 72b, 72c and 72d are provided at the first stage which perform butterfly operations with phase correction, (τ4−τ0), (τ6−τ2), (τ5−τ1) and (τ7−τ3), respectively. At the second stage, two phase correction butterfly operation units 72e and 72f are provided which receive the operation results from the four phase correction butterfly operation units 72 at the former stage and then perform the phase correction butterfly operations, (τ2−τ0) and (τ3−τ1), respectively. At the third stage, one phase correction butterfly operation unit 72g is provided, which receives the operation results from the two phase correction butterfly operation units 72 at the former stage and performs the phase correction butterfly operation (τ1−τ0). The output data from the last stage is FFT output data for which the phase errors of the respective interleaving ways were corrected. Please note that the bit reverse unit 70 changes an order of the input data units like a typical butterfly operation unit. Moreover, it should be noted that, although τ0 is explicitly shown in the above description, τ0=0 since the first way is used as the reference.

Each phase correction butterfly operation unit 72 is similar to that in a case of two-way interleaving described above, and performs the butterfly operation with the phase error correction for the time difference τ that is to be corrected. However, the correction amounts are different from each other. That is, the first stage performs the operations for correction by (τ4−τ0), (τ6−τ2), (τ5−τ1) and (τ7−τ3); the second stage performs the operations for correction by (τ2−τ0) and (τ3−τ1); and the third stage performs the operations for correction by (τ1−τ0). The output data from the last stage is the FFT output data for which the phase errors τ1, τ2, τ3, τ4, τ5, τ6 and τ7 of the respective interleaving ways was corrected.

Figure 7A:
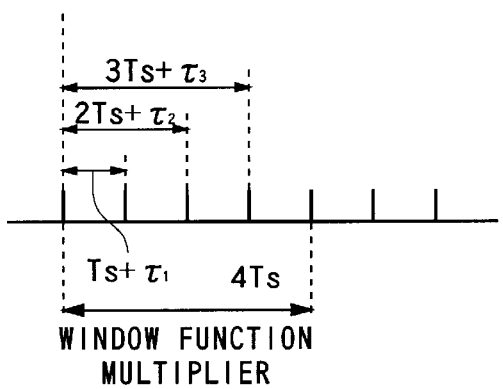
FIGS. 7A and 7B show the principle and structure in a case of 4-way interleaving.
Figure 7B:
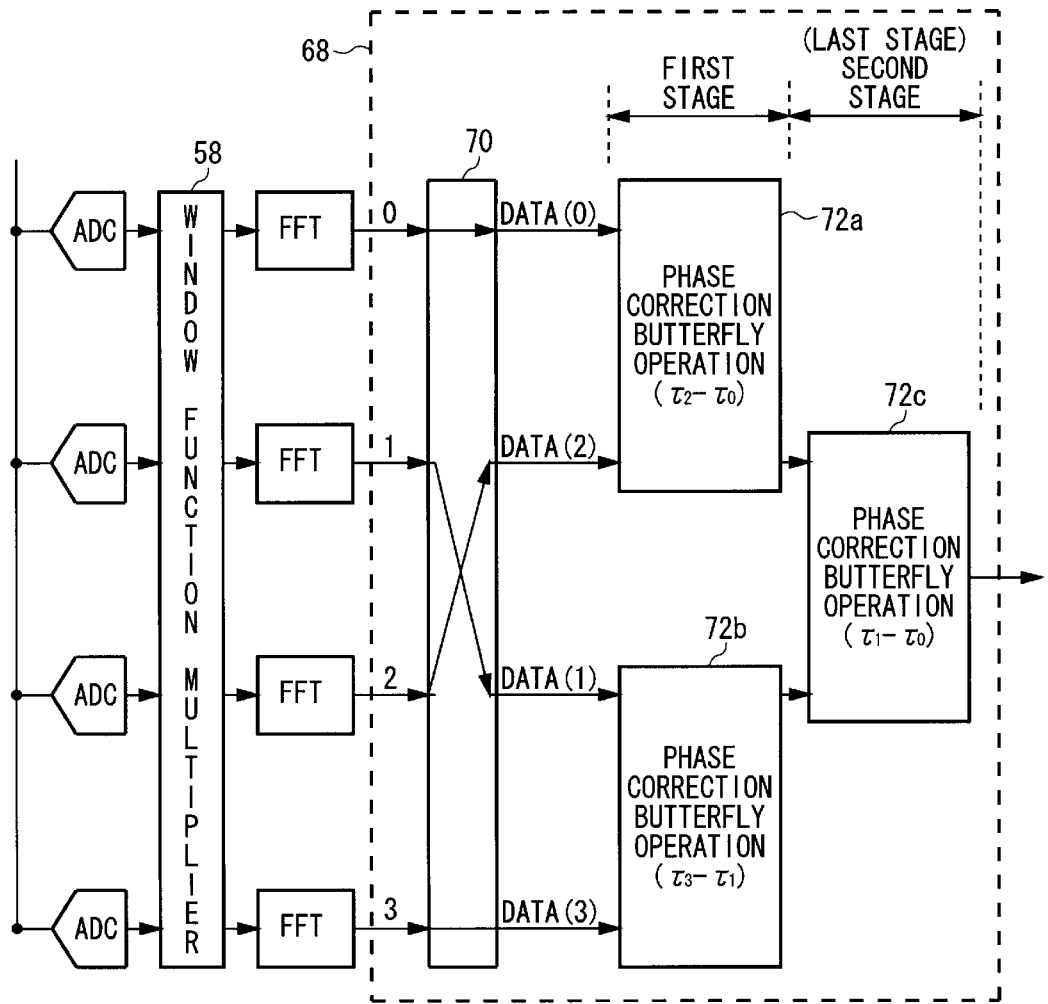

FIGS. 7A and 7B show the principle and the structure in a case of 4-way interleaving. It is assumed that, considering the first way as the reference timing, the phase errors of the other three ways are τ1, τ2 and τ3, respectively.

The internal structure of the phase correction butterfly 68 in the case of 4-way interleaving is formed by a bit-reverse unit 70 and three phase correction butterfly operation units 72, as shown in FIG. 7B, because the butterfly operation with phase correction according to the present invention has to be applied to the last stage, i.e., the second stage as the number of interleaving ways, 4 is $2^2$. The window function multiplier shown in FIG. 7B may have the same or similar function or structure as/to the window function multiplier 58 described referring to FIGS. 2 and 3.

The butterfly operation units 72 receive the output data of the respective ways (DATA(0) to DATA(3)) of FFT operation results from four channels of ADCs and perform butterfly operations for every two inputs. More specifically, since there are four channels, two phase correction butterfly operation units 72a and 72b are provided at the first stage, which perform butterfly operations with phase correction, (τ2−τ0) and (τ3−τ1), respectively. At the second stage, one phase correction butterfly operation unit 72c is provided, which receives the operation results from the two phase correction butterfly operation units 72 at the former stage and performs the phase correction butterfly operation (τ1−τ0). The output data from the last stage is FFT output data for which the phase errors of the respective interleaving ways, τ1, τ2 and τ3, were corrected. In the above example, the description was made while assuming the number of the input data units to be $2^3$ and $2^2$. However, the number of the input data units may be $2^n$ (n is an arbitrary positive integer equal to or larger than one). Moreover, if the process speed is not important, the interleaved data may be subjected to Fourier Transform (FT) or Discrete Fourier Transform (DFT).

Although the present invention has been described by way of exemplary embodiment, the scope of the present invention is not limited to the foregoing embodiment and it should be understood that those skilled in the art might make many changes and substitutions without departing from the spirit and the scope of the present invention which is defined only by the appended claims.

As is apparent from the above, a great advantage can be obtained that the FFT output result in which the errors between the sampling timings were cancelled, by determining the correction coefficient(s) multiplied by the window function multiplier based on the sampling timings, and performing the butterfly operations with the phase correction, which adds the α operation unit, the β operation unit and the β' operation unit, as the butterfly operation of the phase correction butterfly operation unit 72 that serve as the last stage of the FFT operation. Therefore, the technical effects of the present invention are very large, thus providing large industrial economic effects. In the above examples, since the spurious component caused by the phase error was removed, the dynamic range of the A/D converters interleaved with each other can be improved. Moreover, the phase error correction unit and the phase error correction technique in the above examples require no hardware addition, but requires the small burden of calculation. Therefore, considering that the damage of the conventional A/D conversion method by the phase error(s) at the samplings becomes larger as the sampling rate increases with the development of LSI techniques, the FFT processor and the FFT processing method including the window function multiplier and the butterfly operation unit according to the present example have large value for the semiconductor industry.

What is claimed is:

1. A digitizer apparatus comprising:
N A/D converters operable to convert an analog signal output from a semiconductor device to digital signals at different sampling timings, respectively, where N is an integer equal to or larger than two;
a window function multiplier operable to multiply said digital signals by predetermined correction coefficients, respectively; and
an FT processor operable to perform Fourier Transform (FT) for said digital signals multiplied by said predetermined correction coefficients, wherein
said window function multiplier multiplies said digital signals by said correction coefficients based on said sampling timings.

2. A digitizer apparatus as claimed in claim 1, wherein said N A/D converters sample said analog signals at substantially the same frequency, and
said window function multiplier multiplies said digital signals by said correction coefficients based on phase errors between said sampling timings of said N A/D converters digital signals and an ideal sampling timing, respectively.

3. A digitizer apparatus as claimed in claim 1, wherein said window function multiplier has N coefficient multipliers operable to multiply said digital signals by said predetermined correction coefficients, respectively, and
said N coefficient multipliers correspond to said N A/D converters, respectively, and multiply said digital signals converted by said A/D converters corresponding thereto by said correction coefficients, respectively.

4. A digitizer apparatus as claimed in claim 1, wherein said window function multiplier has a memory unit operable to store a plurality of correction coefficients supplied in advance, and
said window function multiplier selects one of said plurality of correction coefficients one by one for said respective digital signal.

5. A digitizer apparatus as claimed in claim 1, wherein said window function multiplier calculates said correction coefficients to be multiplied by said respective digital signals based on said sampling timings, and includes a memory unit operable to store said calculated correction coefficients.

6. A digitizer apparatus as claimed in claim 4, wherein said window function multiplier has N memory units respectively corresponding to N coefficient multipliers, and
said N memory units store said correction coefficients based on phase errors between said sampling timings of said A/D converters corresponding thereto and an ideal sampling timings.

7. A digitizer apparatus as claimed in claim 1, wherein said window function multiplier multiplies said digital signals sampled in an outside of a predetermined time domain by zero.

8. A digitizer apparatus as claimed in claim 1, wherein said FT processor has an interleaving unit operable to generate a data sequence by arranging said digital signals multiplied by said correction coefficients in a predetermined order.

9. A digitizer apparatus as claimed in claim 8, wherein said FT processor has an interleaving unit operable to generate a data sequence by arranging said digital signals that said window function multiplier did not multiply by zero in a predetermined order.

10. A digitizer apparatus as claimed in claim 8, wherein said FT processor performs Fast Fourier Transform (FFT) for said data sequence.

11. A digitizer apparatus as claimed in claim 10, wherein said FT processor further includes:
a first EFT processor operable to perform FFT for a sequence of even-numbered data units of said data sequence;
a second FFT processor operable to perform FFT for a sequence of odd-numbered data units of said data sequence; and
a butterfly operation unit operable to perform a butterfly operation for correcting said digital signals after being subjected to FFT by said first and second FFT processors, based on phase correction coefficients for correcting phase errors between said sampling timings by said N A/D converters and an ideal sampling timing.

12. A digitizer apparatus as claimed in claim 11, wherein said butterfly operation unit multiplies said digital signals after being subjected to FFT by one of said first and second FFT processors by a first phase correction coefficient for correcting said phase errors to perform said butterfly operation.

13. A digitizer apparatus as claimed in claim 12, wherein said butterfly operation unit multiplies said digital signals calculated by said butterfly operation by one of second and third phase correction coefficients that are based on said first phase correction coefficient.

14. A digitizer apparatus as claimed in claim 13, wherein said butterfly operation unit performs an operation using said first, second and third correction coefficients expressed by the following expressions, $$\alpha = \exp[j\pi\tau T s]$$

$$\beta = 1/(1\alpha)$$

$$\beta' = \alpha(1+\alpha)c$$

in a case where said first, second and third phase correction coefficients are $\alpha$, $\beta$, and $\beta'$, respectively, where j is imaginary unit, $\tau$ is said phase error, and T is said ideal sampling timing.

15. A digitizer apparatus as claimed in claim 1, wherein four A/D converters are provided,
said FT processor has four FFT processors operable to perform FFT for said digital data converted by said A/D converters, respectively,
said FT processor includes two stages of butterfly operation units operable to perform butterfly operations for correcting said digital signals after being subjected to FFT based on phase correction coefficients for correcting phase errors ($\tau 0, \tau 1, \tau 2, \tau 3$) between said respective sampling timings of said four A/D converters and an ideal sampling timing,
said butterfly operation units at a first stage perform said butterfly operations for ($\tau 2 - \tau 0$) and ($\tau 3 - \tau 1$), and said butterfly operation unit at a second stage performs said butterfly operation for (τ1−τ0).

16. A digitizer apparatus as claimed in claim 1, wherein eight A/D converters are provided,
said FT processor has eight FFT processors operable to perform FFT for said digital data converted by said A/D converters, respectively,
said FT processor includes three stages of butterfly operation units operable to perform butterfly operations for correcting said digital signals after being subjected to FFT based on phase correction coefficients for correcting phase errors (τ0, τ1, τ2, τ3, τ4, τ5, τ6, τ7) between said respective sampling timings of said eight A/D converters and an ideal sampling timing,
said butterfly operation units at a first stage perform said butterfly operations for (τ4−τ0), (τ6−τ2), (τ5−τ1) and (τ7−τ3),
said butterfly operation units at a second stage perform said butterfly operations for (τ2−τ0) and (τ3−τ1), and
said butterfly operation unit at a third stage performs said butterfly operation for (τ1−τ0).

17. A semiconductor testing apparatus for testing a semiconductor device, comprising:
a pattern generator operable to generate a pattern signal and an expected value signal;
a waveform shaping unit operable to shape a waveform of said pattern signal generated by said pattern generator;
a semiconductor device contact portion, on which said semiconductor device is placed, operable to supply said pattern signal after being shaped by said waveform shaping unit to said semiconductor device and receive an analog signal output from said semiconductor device;
a digitizer apparatus operable to converting said analog signal output from said semiconductor device to a signal; and
a comparator operable to compare said expected value signal output from said pattern generator and said signal output from said digitizer apparatus and determine whether or not the said semiconductor device is defective,
wherein said digitizer apparatus includes:
N A/D converters operable to convert said analog signal output from said semiconductor device to digital signals at different sampling timings, respectively, where N is an integer equal to or larger than two;
a window function multiplier operable to multiply said digital signals by predetermined correction coefficients, respectively; and
an FT processor operable to perform Fourier Transform (FT) for said digital signals multiplied by said predetermined correction coefficients, and
wherein said window function multiplier multiplies said digital signals by said correction coefficients based on said sampling timings respectively.

18. A semiconductor testing apparatus as claimed in claim 17, wherein said FT processor includes:
an interleaving unit operable to generate a data sequence by arranging said digital signals multiplied by said correction coefficients in a predetermined order;
a first FFT processor operable to perform FFT for a sequence of even-numbered data units of said data sequence;
a second FFT processor operable to perform FFT for a sequence of odd-numbered data units of said data sequence; and
a butterfly operation unit operable to perform a butterfly operation for correcting said digital signals after being subjected to FFT, based on phase correction coefficients for correcting phase differences between sampling timings of said N A/D converters and an ideal sampling timing.

19. A semiconductor testing apparatus as claimed in claim 18, wherein said butterfly operation unit multiplies said digital signals after being subjected to FFT by one of said first and second FFT processors by a first phase correction coefficient for correcting said phase errors.

20. A digitizer apparatus as claimed in claim 2, wherein said window function multiplier has N coefficient multipliers operable to multiply said digital signals by said predetermined correction coefficients, respectively, and
said N coefficient multipliers correspond to said N A/D converters, respectively, and multiply said digital signals converted by said A/D converters corresponding thereto by said correction coefficients, respectively.

21. A digitizer apparatus as claimed in claim 2, wherein said window function multiplier has a memory unit operable to store a plurality of correction coefficients supplied in advance, and
said window function multiplier selects one of said plurality of correction coefficients one by one for said respective digital signal.

22. A digitizer apparatus as claimed in claim 3, wherein said window function multiplier has a memory unit operable to store a plurality of correction coefficients supplied in advance, and
said window function multiplier selects one of said plurality of correction coefficients one by one for said respective digital signal.

23. A digitizer apparatus as claimed in claim 2, wherein said window function multiplier calculates said correction coefficients to be multiplied by said respective digital signals based on said sampling timings, and includes a memory unit operable to store said calculated correction coefficients.

24. A digitizer apparatus as claimed in claim 3, wherein said window function multiplier calculates said correction coefficients to be multiplied by said respective digital signals based on said sampling timings, and includes a memory unit operable to store said calculated correction coefficients.

25. A digitizer apparatus as claimed in claim 5, wherein said window function multiplier has N memory units respectively corresponding to N coefficient multipliers, and
said N memory units store said correction coefficients based on phase errors between said sampling timings of said A/D converters corresponding thereto and an ideal sampling timings.

26. A digitizer apparatus as claimed in claim 2, wherein said window function multiplier multiplies said digital signals sampled in an outside of a predetermined time domain by zero.

27. A digitizer apparatus as claimed in claim 3, wherein said window function multiplier multiplies said digital signals sampled in an outside of a predetermined time domain by zero.

28. A digitizer apparatus as claimed in claim 4, wherein said window function multiplier multiplies said digital signals sampled in an outside of a predetermined time domain by zero.

29. A digitizer apparatus as claimed in claim 5, wherein said window function multiplier multiplies said digital signals sampled in an outside of a predetermined time domain by zero.

30. A digitizer apparatus as claimed in claim 6, wherein said window function multiplier multiplies said digital signals sampled in an outside of a predetermined time domain by zero.

31. A digitizer apparatus as claimed in claim 2, wherein said FT processor has an interleaving unit operable to generate a data sequence by arranging said digital signals multiplied by said correction coefficients in a predetermined order.

32. A digitizer apparatus as claimed in claim 3, wherein said FT processor has an interleaving unit operable to generate a data sequence by arranging said digital signals multiplied by said correction coefficients in a predetermined order.

33. A digitizer apparatus as claimed in claim 4, wherein said FT processor has an interleaving unit operable to generate a data sequence by arranging said digital signals multiplied by said correction coefficients in a predetermined order.

34. A digitizer apparatus as claimed in claim 5, wherein said FT processor has an interleaving unit operable to generate a data sequence by arranging said digital signals multiplied by said correction coefficients in a predetermined order.

35. A digitizer apparatus as claimed in claim 6, wherein said FT processor has an interleaving unit operable to generate a data sequence by arranging said digital signals multiplied by said correction coefficients in a predetermined order.

36. A digitizer apparatus as claimed in claim 7, wherein said FT processor has an interleaving unit operable to generate a data sequence by arranging said digital signals multiplied by said correction coefficients in a predetermined order.

37. A digitizer apparatus as claimed in claim 9, wherein said FT processor performs Fast Fourier Transform (FFT) for said data sequence.

* * * * *